[12] United States Patent
Sarma et al.

US006870375B2

(10) Patent No.: US 6,870,375 B2
(45) Date of Patent: Mar. 22, 2005

(54) SYSTEM AND METHOD FOR MEASURING A CAPACITANCE ASSOCIATED WITH AN INTEGRATED CIRCUIT

(75) Inventors: Robin C. Sarma, Plano, TX (US); Xiaowei Deng, Plano, TX (US); James David Gallia, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 93 days.

(21) Appl. No.: 10/187,671

(22) Filed: Jul. 1, 2002

(65) Prior Publication Data

US 2004/0000917 A1 Jan. 1, 2004

(51) Int. Cl.[7] ............................................. G01R 27/26
(52) U.S. Cl. ..................................... 324/658; 324/678
(58) Field of Search ................................ 324/678, 686, 324/658, 649, 600, 515; 257/312, 595; 438/379; 73/335.04, 862.337, 862.626; 367/181; 340/545.4, 562; 320/167; 702/47, 52

(56) References Cited

U.S. PATENT DOCUMENTS

| | | | | |
|---|---|---|---|---|
| 5,602,487 A | * | 2/1997 | Manku | 324/678 |
| 5,999,010 A | | 12/1999 | Arora et al. | 324/765 |
| 6,133,949 A | * | 10/2000 | Reich | 348/180 |
| 6,291,254 B1 | | 9/2001 | Chou et al. | 438/18 |
| 6,366,098 B1 | * | 4/2002 | Froment | 324/678 |
| 6,486,680 B1 | * | 11/2002 | Mull | 324/662 |
| 6,501,283 B2 | * | 12/2002 | Lindolf et al. | 324/679 |
| 6,549,029 B1 | * | 4/2003 | Hsieh et al. | 324/769 |
| 2002/0116696 A1 | * | 8/2002 | Suaya et al. | 716/6 |
| 2002/0130674 A1 | * | 9/2002 | Lagowski et al. | 324/750 |

* cited by examiner

*Primary Examiner*—N. Le
*Assistant Examiner*—Hoai-An D. Nguyen
(74) *Attorney, Agent, or Firm*—Peter K. McLarty; W. James Brady, III; Frederick J. Telecky, Jr.

(57) ABSTRACT

A method for measuring a capacitance associated with a portion of an integrated circuit is provided that includes coupling a measurement circuit to an integrated circuit. One or more transistors within the integrated circuit are initialized such that a steady-state associated with one or more of the transistors is achieved. A capacitance associated with the portion of the integrated circuit is then measured using the measurement circuit. The portion of the integrated circuit is selectively charged and discharged in response to a voltage potential being applied thereto such that a drain current is generated that serves as a basis for the capacitance measurement.

17 Claims, 6 Drawing Sheets

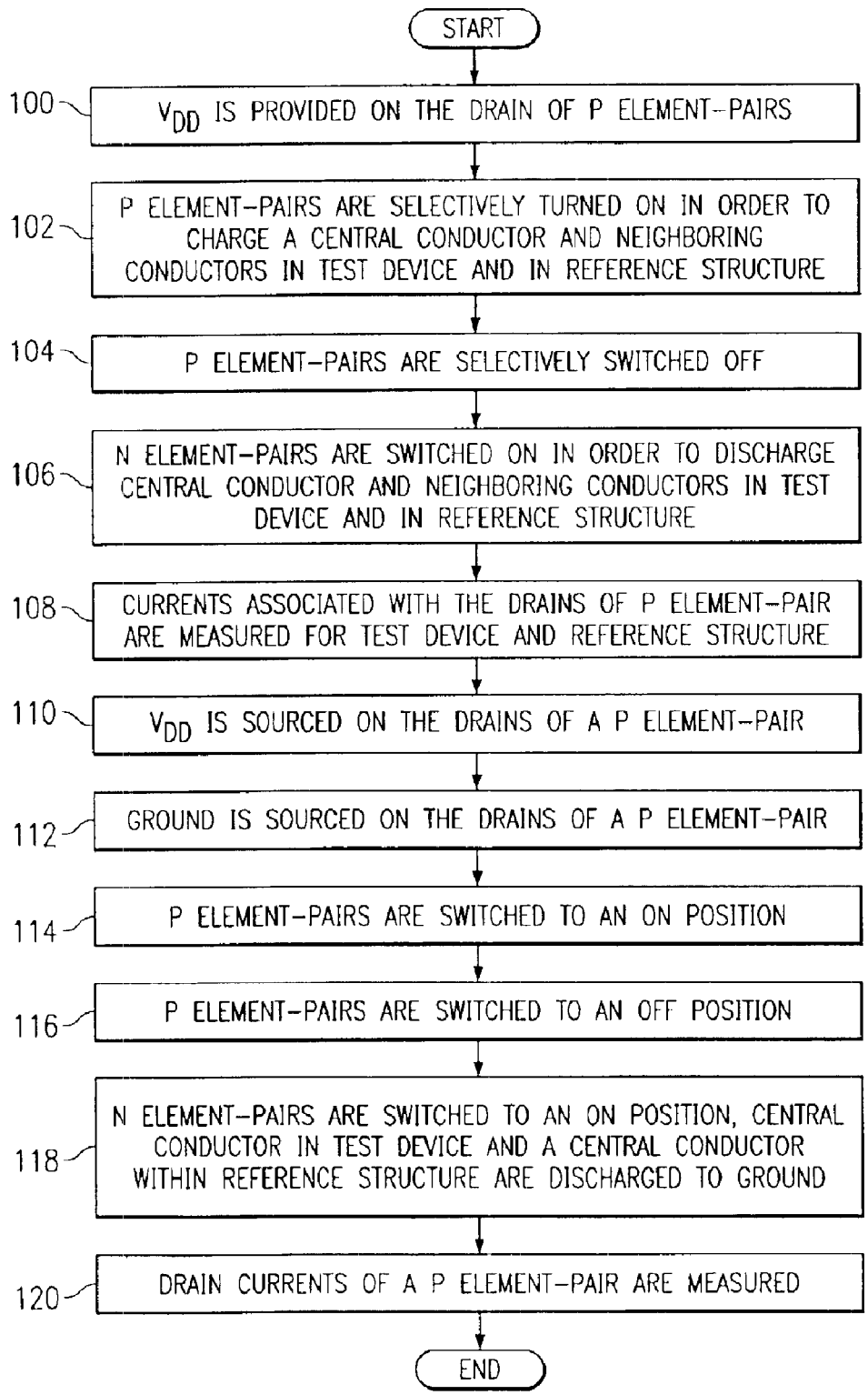

SYSTEM AND METHOD FOR MEASURING A CAPACITANCE ASSOCIATED WITH AN INTEGRATED CIRCUIT

CROSS REFERENCE TO RELATED APPLICATIONS

This Application is related to U.S. patent application Ser. No. 10/172,190 filed Jun. 14, 2002, entitled "SYSTEM AND METHOD FOR MEASURING A CAPACITANCE OF A CONDUCTOR."

TECHNICAL FIELD OF THE INVENTION

This invention relates in general to integrated circuits and more particularly to a system and method for measuring a capacitance associated with an integrated circuit.

BACKGROUND OF THE INVENTION

The design and manufacture of integrated circuits has become increasingly important in the field of semiconductors. Achieving the proper metal capacitance of integrated circuits is critical to the functionality, performance, and reliability of integrated circuits. The ability to closely monitor the manufacture of integrated circuits and semiconductors is similarly important. Semiconductor characteristics or parameters that vary significantly from their designated values may cause significant problems in systems or architectures with precise or exact specifications. Elements associated with transistor specifications, and interconnect specifications including metal thickness, trench width, conductor spacing, and dielectric thickness, represent essential criterion to be controlled during the integrated circuit manufacturing process. When system parameters become skewed because of inaccurate test results or errors in the manufacture of integrated circuits, the byproduct may be components or devices that are incompatible with neighboring elements, that have poor performance, or that are non-operational for their intended purpose.

SUMMARY OF THE INVENTION

From the foregoing, it may be appreciated by those skilled in the art that a need has arisen for an improved measuring approach that provides for effective and accurate capacitance measurements of an integrated circuit. In accordance with one embodiment of the present invention, a system and method for measuring a capacitance associated with a portion of an integrated circuit are provided that substantially eliminate or greatly reduce disadvantages and problems associated with conventional capacitance measurement techniques.

According to one embodiment of the present invention, there is provided a method for measuring a capacitance associated with a portion of an integrated circuit that includes coupling a measurement circuit to an integrated circuit. One or more transistors within the integrated circuit are initialized such that a steady-state associated with one or more of the transistors is achieved. A capacitance associated with the portion of the integrated circuit is then measured using the measurement circuit. The portion of the integrated circuit is selectively charged and discharged in response to a voltage potential being applied thereto such that a drain current is generated that serves as a basis for the capacitance measurement.

Certain embodiments of the present invention may provide a number of technical advantages. For example, according to one embodiment of the present invention, a measurement approach is provided that allows highly accurate capacitance measurements to be obtained for a semiconductor as it propagates through the manufacturing process. The enhanced accuracy of the capacitance measurement is a result of the elimination of capacitances between elements or conductors of a device under test. The elimination of their capacitance is achieved by charging and discharging multiple conductors in phase and thus effectively shorting neighboring conductors proximate to a conductor being targeted for the capacitance measurement. Accordingly, the capacitances of associated or neighboring elements that may otherwise act to negatively influence a capacitance measurement are negated or otherwise removed from the measurement equation. The enhanced capacitance measurement provides the opportunity to more closely monitor the manufacture of a semiconductor.

Another technical advantage of one embodiment of the present invention is a result of the isolation or separation of a capacitance associated with a transistor and a capacitance associated with surrounding interconnects. The ability to identify two distinct capacitance measurements associated with these elements allows for a more accurate identification of potential problems in the manufacturing process. This would provide the opportunity for an administrator of the integrated circuit manufacturing process to modify or otherwise change manufacturing characteristics specific to either the interconnects within the integrated circuit or the transistors of the integrated circuit, or both. The distinct capacitance values for each may be compared with simulation values in order to determine whether or not an integrated circuit is adequate for its intended design. This scrutinizing feature may be particularly important where specifications or design standards are required to be within certain ranges or specified parameters. Embodiments of the present invention may enjoy some, all, or none of these advantages. Other technical advantages may be readily apparent to one skilled in the art from the following figures, description, and claims.

BRIEF DESCRIPTION OF THE DRAWINGS

To provide a more complete understanding of the present invention and features and advantages thereof, reference is made to the following description, taken in conjunction with the accompanying figures, wherein like reference numerals represent like parts, in which:

FIG. 3 is a flowchart illustrating a series of steps associated with a method for measuring a capacitance of a portion of an integrated circuit;

DETAILED DESCRIPTION OF THE INVENTION

Figure 1:
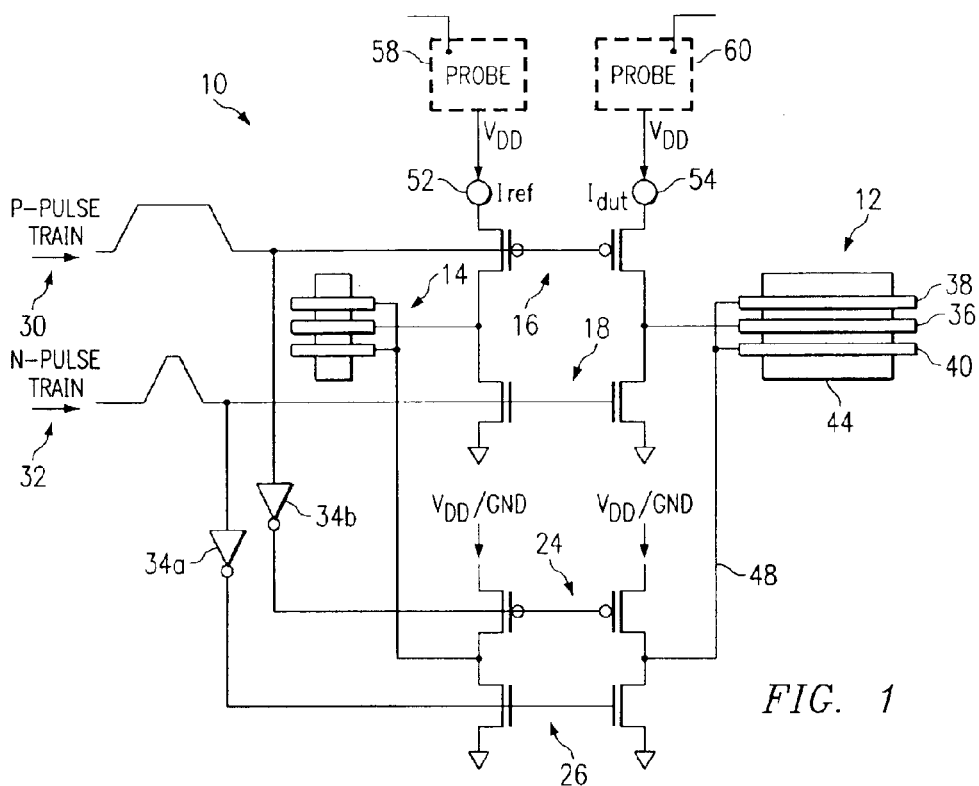
FIG. 1 is a simplified circuit diagram of a measurement system for measuring a capacitance of a portion of an integrated circuit.

FIG. 1 is a simplified block diagram of a measurement system 10 that may be coupled to an integrated circuit in order to measure a capacitance associated with a portion of the integrated circuit in accordance with one embodiment of the present invention. Measurement system 10 includes a test device 12, a reference structure 14, a first set of p and n element-pairs 16 and 18, and a second set of p and n element-pairs indicated generally at 24 and 26. In general, each element or section within test device 12 may be coupled to an additional set of p and n element-pairs similar to those illustrated in FIG. 1. Measurement system 10 additionally includes a p-pulse train input indicated generally at 30 and an n-pulse train input indicated generally at 32. The pulse trains may be arranged such that when one selected p element is ON, the n element is OFF and when the p element is OFF, the n element is ON.

Measurement system 10 operates to measure a capacitance associated with an element or section within test device 12. Elements within test device 12 may be selectively charged and discharged in response to p-pulse train 30 and n-pulse train 32. P element-pairs 16 and 24 and n element-pairs 18 and 26 may be switched ON and OFF at a designated frequency such that two currents may be measured at the drains associated with p element-pair 16. The currents may then be subtracted from each other in order to obtain a net current that reflects the capacitance of an element within test device 12 with respect to other elements within test device 12. Accordingly, selected elements within test device 12 may be charged and discharged either in or out of phase, in order to obtain a current at a corresponding drain that provides a basis for determining a capacitance associated with only the designated element of test device 12.

In addition, reference structure 14 may be used generally to offset parasitic capacitance effects of transistors or internal circuitry associated with measurement system 10. For example, p element-pair 16 and n element-pair 18 may each include some capacitance that may influence or otherwise skew a capacitance measurement that is associated with test device 12. Reference structure 14 may operate to eliminate parasitic capacitances by compensating for their presence when currents are measured at the drains of p element-pair 16. Accordingly, one drain current associated with reference structure 14 may be subtracted from another drain current associated with test device 12 such that inherent capacitances are effectively eliminated.

Additionally, the operation of charging and discharging elements within test device 12 using p-pulse train 30 and n-pulse train 32 offers a capability for measuring the average, steady-state currents on the drains of p element-pair 16. In this manner, an alternating current (AC) phenomenon may be converted into a direct current (DC) value that may be quickly and accurately measured.

Measurement system 10 may generally be any suitable size, such as 30 µm wide by 100 µm long for example, such that it may adequately fit into an area of the integrated circuit being tested. Measurement system 10 may alternatively be any suitable width and length where appropriate such that it may be used to make a capacitance measurement in a designated area of a device, component, circuit, or element.

Test device 12 is an element, a structure, or an object having a capacitance associated therewith to be evaluated or measured by measurement system 10. Test device 12 may include a central conductor 36, a set of neighboring conductors 38 and 40 proximate to central conductor 36, and a plate 44. In a particular embodiment of the present invention, central conductor 36 is the target element to which a capacitance measurement is sought to be taken. Central conductor 36 may be any wire, object, component, or element capable of generating a capacitance value. Central conductor 36 may be within or external to any component, device, system, or architecture. Neighboring conductors 38 and 40 may be any conductive or non-conductive elements positioned in the vicinity of central conductor 36. Neighboring conductors 38 and 40 may be any wire, object, component, or element that may have a capacitance value associated with them. The inputs and outputs associated with test device 12 may correspond to data pathways or couplings to any suitable element, such as logic gates, semiconductors, or any other component, device, object, or element. In a particular embodiment of the present invention, conductors 38 and 40 are physically shorted through a connection such that both may be charged and discharged by p and n element-pairs 24 and 26. In at least one respect, neighboring conductors 38 and 40 represent a single conductor as their connection effectively provides a short. In general, conductors 38 and 40 need not be connected, and each conductor may be independently charged and discharged by separate p and n element-pairs. Although illustrated as a straight line, central conductor 36 and neighboring conductors 38 and 40 may be any suitable shape and configured, arranged, or positioned in any appropriate manner where appropriate according to particular needs.

P element-pairs 16 and 24 and n element-pairs 18 and 26 are p and n semiconductor devices respectively that may switch ON and OFF in response to an applied voltage potential and pulse train inputs provided by p-pulse train 30 and n-pulse train 32, respectively. P element-pairs 16 and 24 may be any suitable p device, such as a P-MOSFET, for example, that is operable to selectively charge any of the elements within test device 12. In addition, n element-pairs 18 and 26 may be any suitable n device, such as an N-MOSFET, for example, that is operable to selectively discharge any of the elements within test device 12. Alternatively, p element-pairs 16 and 24 and n element-pairs 18 and 26 may be any suitable semiconductor component, element, or device, or a non-semiconductor element that is operable to provide selective charging and discharging of any element within test device 12. Suitable algorithms may be implemented in order to switch the potential of the drains of p element-pair 24 between $V_{DD}$ and ground or to selectively switch other semiconductor devices within measurement system 10 to ON and OFF positions.

P element-pairs 16 and 24 and n element-pairs 18 and 26 may be used to independently charge and discharge elements within test device 12 in a programmed manner in order to allow for the measurement of capacitances between any combination of elements or bodies in a multi-element environment of test device 12. By charging and discharging multiple conductors in phase, the capacitance between the conductors may be eliminated because no charge difference occurs between the conductors. This approach achieves the effect of an alternating current (AC) shorting of the conductors. The effect of p-pulse train 30 may be controlled by the application of a $V_{DD}$ potential to the drain of p element-pairs 16 and 24.

P element-pairs 16 and 24, and n element-pairs 18 and 26 may be high-voltage transistors in accordance with one embodiment of the present invention. Alternatively, any suitable voltage transistors may be used such that conductors within reference structure 14 and test device 12 are adequately charged and discharged. The use of high-voltage transistors, such as 3.3 volt transistors for example, may increase the current measured by current meters 52 and 54, which in turn may increase capacitance measurement accuracy. Gated diodes may be used where appropriate in order to provide antennae protection for p element-pairs 16 and 24 and n element-pairs 18 and 26.

In operation, p element-pair 16 receives a voltage potential of $V_{DD}$ as illustrated in FIG. 1. As p element-pair 16 and n element-pair 18 switch to ON and OFF positions respectively, central conductor 36 may respond by charging to a voltage potential of $V_{DD}$. As p element-pair 16 and n element-pair 18 switch to OFF and ON positions respectively, central conductor 36 may respond by discharging to ground. In addition, p element-pair 24 may be suitably toggled between $V_{DD}$ and ground. P element-pair 24 and n element-pair 26 are coupled to neighboring conductors 38 and 40 through a connection 48 as illustrated in FIG. 1. Connection 48 operates as a short between neighboring conductors 38 and 40 in order to form a single conductor when a potential is applied to neighboring conductors 38 and 40. Depending on whether a voltage potential of $V_{DD}$ is applied to the drains of p element-pair 24 or the respective drains are grounded, neighboring conductors 38 and 40 may be charged and discharged in phase with central conductor 36 or kept at ground respectively. When neighboring conductors 38 and 40 are kept at ground, the current measured at the drain of p element-pair 16 is due to the capacitance of central conductor 36 with respect to neighboring conductors 38 and 40 and plate 44.

When neighboring conductors 38 and 40 are charged and discharged in phase (at any appropriate frequency, such as 1–10 MHz, for example) with central conductor 36, the capacitance associated with neighboring conductors 38 and 40 is eliminated such that a current may be measured that reflects only the capacitance with respect to plate 44. Thus, a total capacitance that accounts for all elements within test device 12 may be measured and an additional capacitance associated with central conductor 36 may also be measured with respect to plate 44. The latter capacitance value may then be subtracted from the former capacitance value in order to obtain a capacitance due to neighboring conductors 38 and 40.

Reference structure 14 is a null structure that is used to offset parasitic capacitances found in measurement system 10. Elements such as transistors, logic elements, or other semiconductor components or objects offer a capacitance that needs to be accounted for when making a capacitance measurement for central conductor 36. Reference structure 14 may comprise material similar to that of test device 12 in a particular embodiment of the present invention. However, reference structure 14 may alternatively comprise any suitable material according to particular needs. Reference structure 14 may also be the same height and include multiple conductors that are approximately the same width as test device 12. Reference structure 14 may change structurally in response to changes in test device 12. Generally, reference structure 14 may be configured to be symmetrical with respect to test device 12, whereby reference structure 14 includes elements similar to those included in test device 12. Reference structure 14 may include two neighboring conductors (similar to test device 12) that are shorted by a wire coupled to p element-pair 24 and n element-pair 26 in a particular embodiment of the present invention. A central conductor associated with reference structure 14 may be coupled to p element-pair 16 and n element-pair 18 as illustrated in FIG. 1. In addition, reference structure 14 includes an overhang feature that is associated with corresponding conductors and that is similarly provided in test device 12. This overhanging symmetry between reference structure 14 and test device 12 and its corresponding effects for purposes of taking capacitance measurements are described in more detail below with reference to FIGS. 2A–C. Suitable software may be used to configure reference structure 14 or other null devices that are used as a reference in measuring a capacitance associated with test device 12. It is important to note that reference structure 14 may be any suitable device or element having any suitable characteristics such that one or more parasitic capacitances may be negated or accounted for in measuring a capacitance value of central conductor 36.

In operation, reference structure 14 generates a current provided at a drain of p element-pair 16. The drain current associated with reference structure 14 may be subtracted from the current measurement taken at the other drain of p element-pair 16 in order to compensate for the impact of inherent capacitance effects. The removal or compensation of elements within measurement system 10 provides for more accurate capacitance measurements as elements that would otherwise skew a capacitance measurement associated with central conductor 36 are offset by reference structure 14.

Reference structure 14 cooperates with test device 12 in order to obtain a capacitance value associated with an element within test device 12. When p element-pair 16 is in an ON position, p element-pair 16 operates to charge central conductor 36 to a $V_{DD}$ potential. When p element-pair 16 is switched to an OFF position and n element-pair 18 is switched to the ON position, central conductor 36 may then be discharged to ground. Central conductor 36 continues to charge and discharge as associated p and n devices are switched ON and OFF. During the charging and discharging, a measurement of a current associated with the drain of p element-pair 16 may be obtained. The same general procedure is occurring with respect to reference structure 14.

P-pulse train 30 and n-pulse train 32 control or otherwise switch ON and OFF p and n devices or elements coupled thereto within measurement system 10. P-pulse train 30 and n-pulse train 32 may be generated by suitable pulse generators operable to provide pulsing signals to p element-pairs 16 and 24 and n elements pairs 18 and 26. P element-pairs 16 and 24 and n element-pairs 18 and 26 receive similar inputs from p-pulse train 30 and n-pulse train 32 respectively. P-pulse train 30 and n-pulse train 32 represent two continuous pulse trains that may be timed relative to each other at an initiation stage of measurement system 10. The pulsing signals may be applied when a set of probes 58 and 60 (discussed in more detail below) contact corresponding probe pads (potentially including a short delay in order to achieve a steady-state).

Measurement system 10 may also include multiple inverters 34a and 34b. Inverters 34a and 34b may be added in order to charge and discharge associated p and n devices out of phase in order to improve measurement accuracy. A suitable multiplexing element (not shown) may also be provided in conjunction with inverters 34a and 34b such that one or more signals are adequately processed within measurement system 10. Inverters 34a and 34b may be used to double current measurements obtained by current meters 52 and 54. It is important to note that inverters 34a and 34b may be eliminated where appropriate, whereby measurement system 10 continues to function and operate normally. In addition, program testers may be configured in order to provide a pair of non-overlapping, steady-state pulse trains to p and n element-pair inputs. The production testers may enable the measurement of steady-state currents on probes 58 and 60. By increasing the current being measured for a given structure, the accuracy and efficiency of measurement system 10 may be significantly improved. The production testers may be used to measure current at a pico-ampere level in accordance with a particular embodiment of the present invention.

Plate 44 is an element that may be grounded and that provides an environment for test device 12 during measurement of the capacitance associated with central conductor 36. Plate 44 may also be a conductor that is coupled to an additional set of p and n element-pairs similar to those at 24 and 26, and that is operable to charge and discharge where appropriate in order to obtain a capacitance measurement associated with central conductor 36. Whether plate 44 is grounded or charged to a certain potential and then discharged may be controlled by inputs provided to its p and n element-pairs.

A pair of current meters 52 and 54 may be provided at each of the drains of p element-pair 16. Current meters 52 and 54 operate to measure a current associated with reference structure 14 and test device 12 respectively. By subtracting the current obtained by current meter 52 from the current obtained by current meter 54, a net current may be obtained that compensates for internal parasitic capacitances found in measurement system 10. Thus, the impact of transistors or circuitry within measurement system 10 may be removed or otherwise accounted for by the implementation of reference structure 14 as a corresponding inherent current is factored into the capacitance measurement. After obtaining a net current, a capacitance may then be determined based on the equation: I(current)=C(capacitance)×V(voltage)×f(frequency). Frequency represents the frequency at which elements within test device 12 are charged and discharged, whereby the voltage represents the potential to which elements such as central conductor 36 are charged.

Probes 58 and 60 may also be included in measurement system 10 in order to provide a capacitance measurement associated with test device 12. Probes 58 and 60 may include suitable probe pads where appropriate and are coupled to current meters 52 and 54, respectively. Probes 58 and 60 may also include suitable software operable to identify additional parameters associated with test device 12 or to selectively determine information associated with test device 12 that is based on measurements taken or data collected by measurement system 10.

Figure 2A:
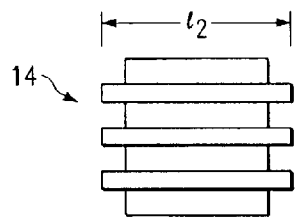
FIGS. 2A–2C are diagrammatic views illustrating a reference structure, a test device, and a net structure respectively that are associated with the measurement circuit.
Figure 2B:
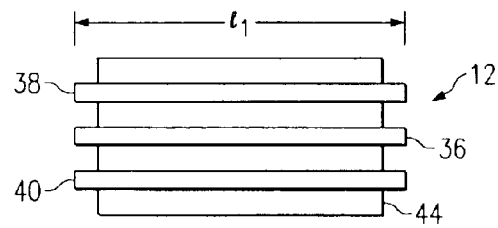
Figure 2C:
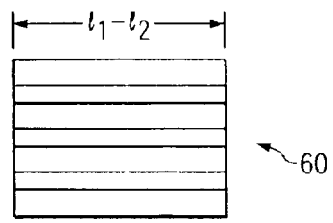

FIGS. 2A–C are diagrammatic views that illustrate an overhanging effect resulting from a conductor that protrudes beyond the length of an underlying plate structure. Reference structure 14 is illustrated in FIG. 2A, test device 12 is illustrated in FIG. 2B, and a resultant or net structure 60 is illustrated in FIG. 2C in order to teach the effects of an overhanging element or characteristic. Test device 12 includes conductor 36 having a length of $l_1$ and reference structure 14 includes a conductor having a length of $l_2$. Test device 12 includes plate 44 and reference structure 14 includes a similar plate element having approximately the same height. Resultant structure 60 represents the subtraction of $l_2$ from $l_1$ in order to provide a result that compensates for the overhanging effect of conductors that protrude beyond underlying elements or the environments associated with reference structure 14 and test device 12. For example, if $l_1$ and $l_2$ were 120 $\mu$m and 20 $\mu$m respectively, resultant structure 60 would reflect an effective capacitance over a 100 $\mu$m unit length.

Resultant structure 60 represents a more exact capacitance associated with the corresponding conductor that is targeted for measurement. The three-dimensional edge effects of conductors that may otherwise generate an electric field energy (thereby influencing capacitance measurements) may be negated with the implementation of reference structure 14. Accordingly, a two-dimensional capacitance may be obtained that removes the effects of the protruding ends of the conductor. A two-dimensional capacitance may be generally easier to model or otherwise to design for in developing a system or an architecture that includes the corresponding conductor.

The negation of overhanging effects is beneficial for a number of additional reasons. For example, it may be generally easier to correlate silicon measurements with two-dimensional analytical simulations instead of three-dimensional elements. In addition, parasitic extraction tools may require two-dimensional capacitance coefficients not provided by a three-dimensional element. Thus reference structure 14 allows end regions of a three-dimensional structure of a conductor to be accounted for in order to generate a more ideal two-dimensional capacitance per unit length result.

In operation, measurement system 10 may obtain a capacitance value for a designated element within test device 12. P element-pair 16 and n element-pair 18 may be used to charge and to discharge central conductor 36 of test device 12 and a similar central conductor of reference structure 14. P element-pair 24 and n element-pair 26 may also be used to perform other tasks, such as to maintain neighboring conductors 38 and 40 of test device 12 (and corresponding neighboring conductors within reference structure 14) at a reference potential. In addition, p element-pair 24 and n element-pair 26 may be used to charge neighboring conductors 38 and 40 of test device 12 (and corresponding neighboring conductors within reference structure 14) to a potential of $V_{DD}$ and further to discharge them synchronously in phase with central conductor 36. Additionally, p element-pair 24 and n element-pair 26 may be used to charge neighboring conductors 38 and 40 within test device 12 (and corresponding neighboring conductors within reference structure 14) to a potential of $V_{DD}$ and further to discharge them 180° out of phase with respect to central conductor 36. This operation may function to double the capacitance and corresponding measured current at a drain associated with p element-pair 16, which generally results in improved measurement accuracy.

Also, plate 44 and the plate associated with reference structure 14 may be kept at a designated reference potential, such as ground for example. Two non-overlapping pulse trains (p-pulse train 30 and n-pulse train 32) may be applied to p element-pairs 16 and 24 and n element-pairs 18 and 26. Two sets of measurements may then be obtained in accordance with one embodiment of the present invention.

In the first set of measurements, $V_{DD}$ may be provided on the drain of p element-pair 16 and p element-pair 24 by any suitable voltage source or an appropriate connection thereto. The associated p element-pairs may be turned ON in order to charge central conductor 36 and neighboring conductors 38 and 40 in both test device 12 and in corresponding elements within reference structure 14. The p elements may then be selectively switched OFF. N element-pairs 18 and 26 may then be switched ON in order to discharge central conductor 36 and neighboring conductors 38 and 40 in test device 12 and correspondingly in reference structure 14. The cycle may continue at any suitable frequency that produces reliable and suitable charging and discharging functions. Currents associated with the drains of p element-pair 16 may then be measured for both test device 12 and reference structure 14. When neighboring conductors 38 and 40 are charged and discharged in phase with central conductor 36, capacitances between central conductor 36 and neighboring conductors 38 and 40 are eliminated because no charge difference occurs between them.

In the second set of measurements, $V_{DD}$ is sourced on the drains of p element-pair 16 and may be provided by any suitable voltage source or an additional voltage source or an appropriate connection thereto. A ground may then be sourced on the drains of p element-pair 24 that keeps neighboring conductors 38 and 40 in test device 12 and in reference structure 14 at a fixed potential. At this point when p element-pairs 16 and 24 are switched to an ON position, only central conductor 36 in test device 12 and a corresponding central conductor of reference structure 14 are charged to $V_{DD}$. After these p elements are switched to an OFF position, n element-pairs 18 and 26 may be switched to an ON position and central conductor 36 in test device 12 and a corresponding central conductor within reference structure 14 are discharged to ground. The cycle may continue at any suitable frequency that produces reliable and suitable charging and discharging functions for measurement system 10. At this point, drain currents of p element-pair 16, which charges central conductor 36 and a central conductor associated with reference structure 14, may be measured.

The second set of measurements provides a total capacitance of central conductor 36 with respect to plate 44 and to neighboring conductors 38 and 40. The accuracy of the measurements may be checked by monitoring the DC characteristics of each of p element-pairs 16 and 24 and n element-pairs 18 and 26. The accuracy may also be checked by observing the linearity of the current measurements against frequency and voltage values.

FIG. 3 is a flowchart illustrating a series of steps related to a method for measuring a capacitance associated with a portion of an integrated circuit in accordance with one embodiment of the present invention. The method begins at step 100 where $V_{DD}$ is provided on the drains of p element-pairs 16 and 24 by any suitable voltage source or an appropriate connection thereto. At step 102, the associated p element-pairs may be turned ON in order to charge central conductor 36 and neighboring conductors 38 and 40 in both test device 12 and in corresponding elements within reference structure 14. The p elements may then be selectively switched OFF at step 104. At step 106, n element-pairs 18 and 26 may then be switched ON in order to discharge central conductor 36 and neighboring conductors 38 and 40 in test device 12 and in corresponding elements within reference structure 14. The cycle may continue at any suitable frequency that produces reliable and suitable charging and discharging functions for measurement system 10.

At step 108, currents associated with the drains of p element-pair 16 may then be measured for both test device 12 and reference structure 14. When neighboring conductors 38 and 40 are charged and discharged in phase with central conductor 36, capacitances between central conductor 36 and neighboring conductors 38 and 40 are eliminated because no charge difference occurs between them.

In a second set of measurements beginning at step 110, $V_{DD}$ is sourced on the drains of p element-pair 16 and may be provided by any suitable voltage source, or an additional voltage source, or an appropriate connection thereto. A ground may then be sourced on the drains of p element-pair 24 that keeps neighboring conductors 38 and 40 in test device 12 and in reference structure 14 at a fixed potential. This operation is illustrated by step 112. At step 114, when p element-pairs 16 and 24 are switched to an ON position, only central conductor 36 in test device 12 and a corresponding central conductor of reference structure 14 are charged to $V_{DD}$. After these p elements are switched to an OFF position at step 116, n element-pairs 18 and 26 may be switched to an ON position at step 118 and central conductor 36 in test device 12 and a corresponding central conductor within reference structure 14 are discharged to ground. The cycle may continue at any suitable frequency that produces reliable and suitable charging and discharging functions for measurement system 10. At this point, drain currents of p element-pair 16, which charges central conductor 36 and a central conductor associated with reference structure 14, may be measured as illustrated in step 120.

The total capacitance of central conductor 36 with respect to plate 44 and to neighboring conductors 38 and 40 is provided by the second set of measurements. The accuracy of the measurements may be checked by monitoring the DC characteristics of each p element-pairs 16 and 24 and n element-pairs 18 and 26. The accuracy may also be checked by observing the linearity of the current measurements against frequency and voltage values.

Figure 4:
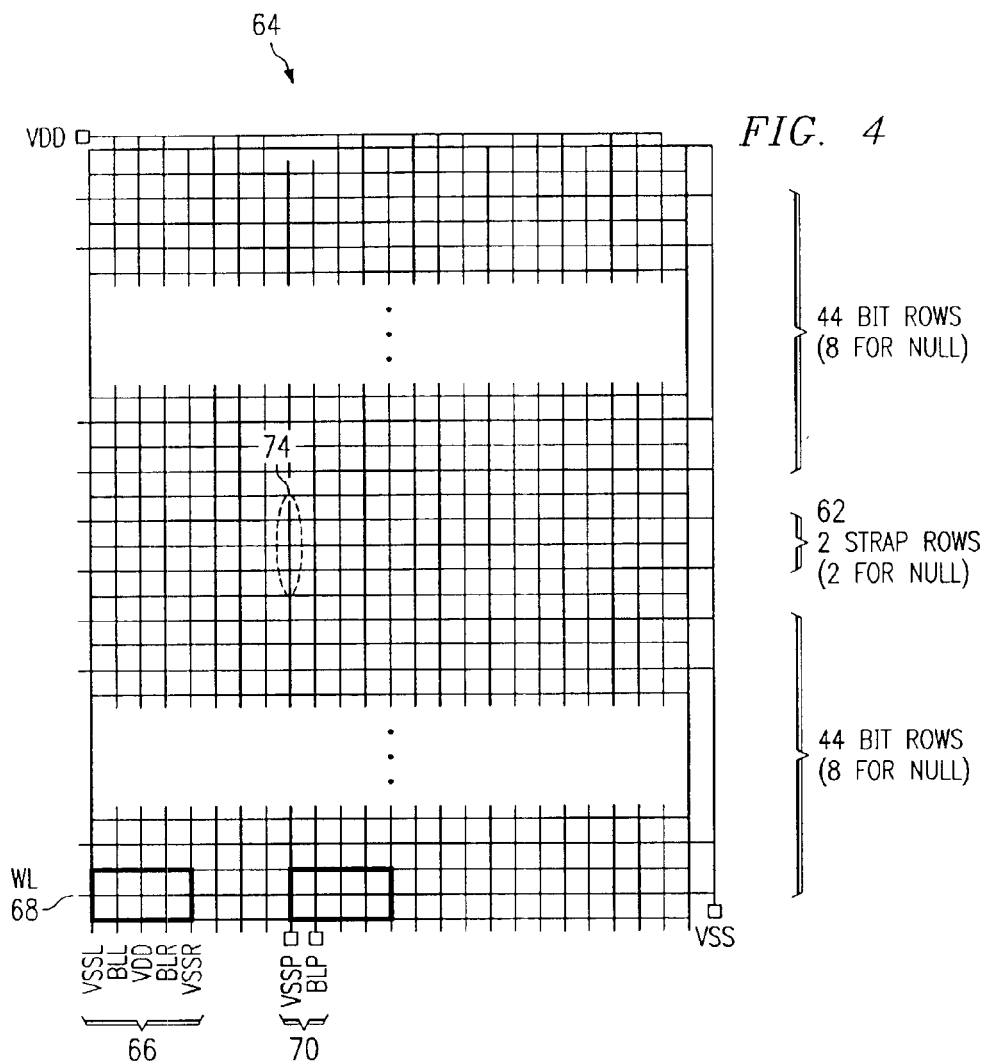
FIG. 4 is a diagrammatic view of a portion of an integrated circuit that includes multiple bit cells to which a capacitance is sought to be measured.
Figure 5:
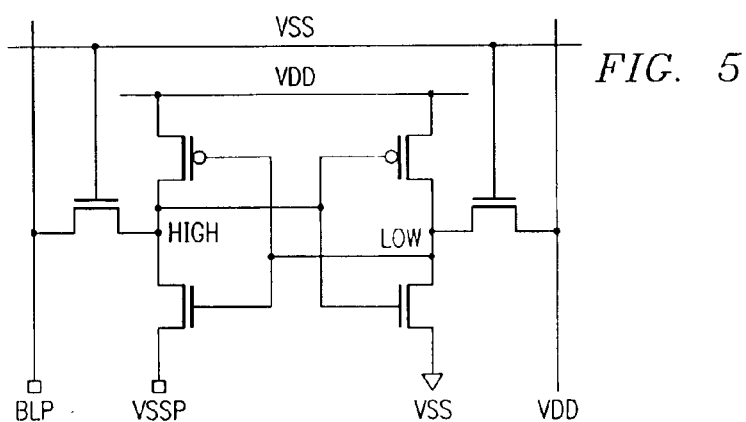
FIG. 5 is a simplified circuit diagram of the bit cells and an example coupling between the bit cells and the measurement circuit.
Figure 6:
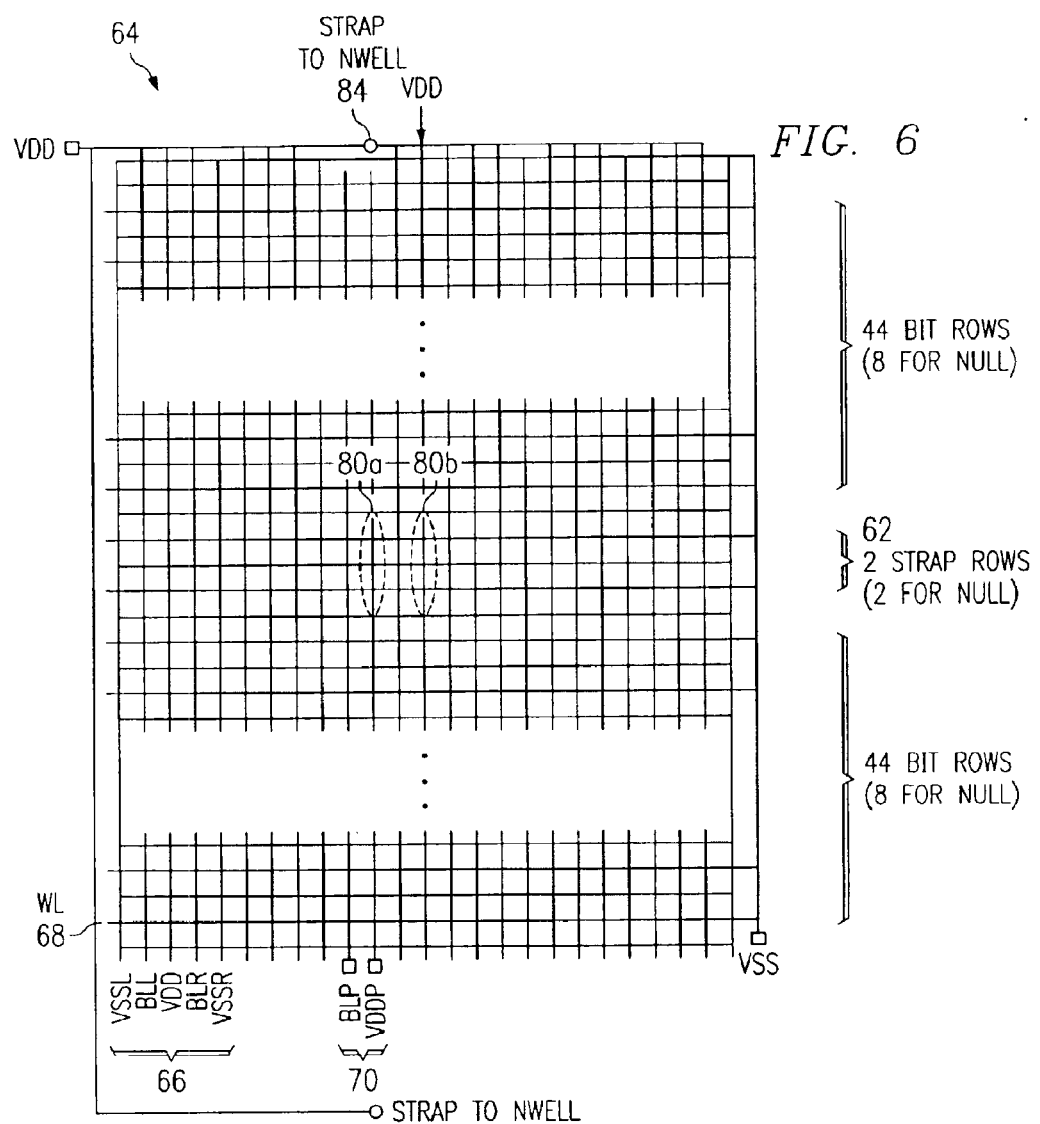
FIG. 6 is a diagrammatic view of the bit cells that further illustrates a next step in performing the capacitance measurement.
Figure 7:
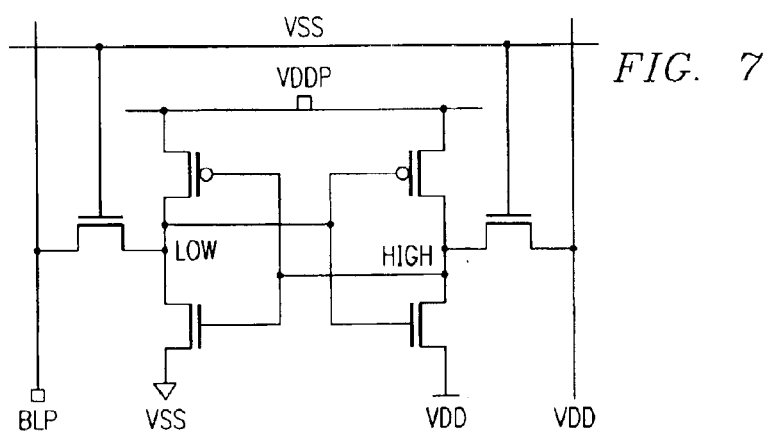
FIG. 7 is a simplified circuit diagram of the bit cells that illustrates another example coupling between the bit cells and the measurement circuit.
Figure 8:
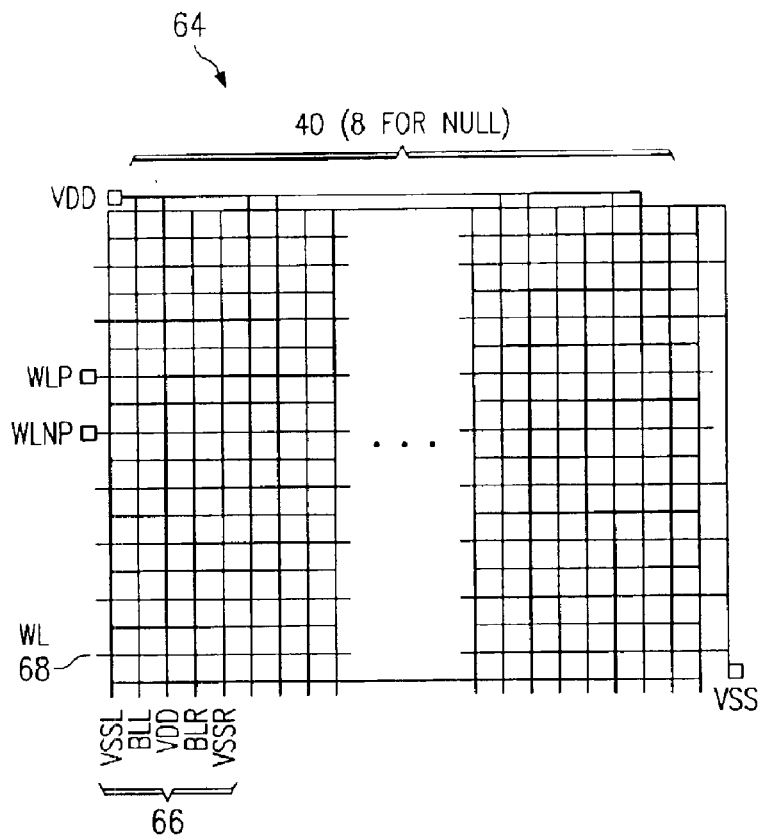
FIG. 8 is a diagrammatic view of the bit cells illustrating a next step in performing the capacitance measurement.
Figure 9:
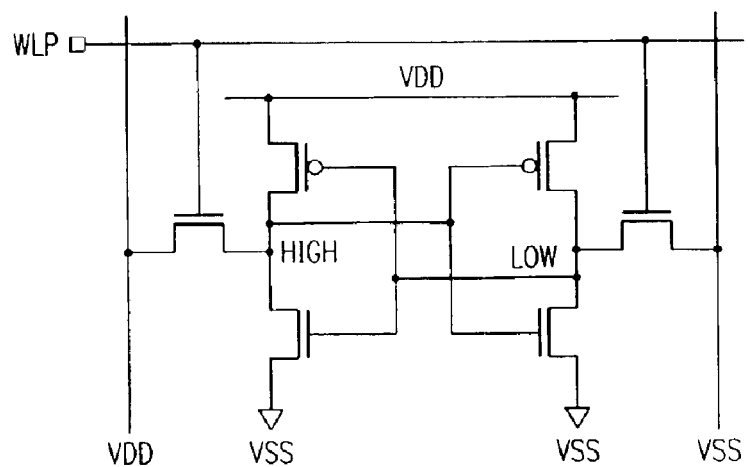
FIG. 9 is a simplified circuit diagram of the bit cells illustrating yet another example coupling between the bit cells and the measurement circuit.

FIGS. 4 through 9 illustrate a series of perspective views and simplified circuit diagrams that are provided in order to show how the capacitance measurement of a specific portion of an integrated circuit (a bit cell 64) may be taken and further how to enhance the accuracy of the capacitance measurement taken by measurement system 10. In accordance with the teachings of the present invention, the figures illustrated in FIGS. 4 through 9 illustrate example steps in executing a capacitance measurement associated with bit cell 64. For purposes of teaching, an overview of these figures is offered. A specific bit cell 64 occupies a two-by-four block area, which has been bolded in the lower left-hand portion of FIG. 4. As referred to herein in this document, bit cell 64 may refer to a specific instance of bit cell 64 or multiple instances of bit cell 64. FIGS. 4 and 5 generally illustrate the measurement of the total capacitance of a selected bit-line (BLP) in bit cell 64 and the coupling capacitance of the selected bit-line to a selected VSS line (VSSP) in bit cell 64. FIGS. 6 and 7 generally illustrate the measurement of the total capacitance of a selected bit-line (BLP) in bit cell 64 and the coupling capacitance of the selected bit-line to a selected VDD line (VDDP) in bit cell 64. FIGS. 8 and 9 generally illustrate the measurement of the total capacitance of a selected word-line (WLP) in bit cell 64 and the coupling capacitance of the selected word-line to a selected neighboring word-line (WLNP) in a neighboring bit cell 64.

Additionally, it should be noted that the elements illustrated in FIGS. 4 through 9 may include a set of test structures potentially coupled to (or included within) measurement system 10 where appropriate in order to enable the transistor specifications, metal width, metal spacing, metal thickness, dielectric thickness, and other parameters to be inferred from the capacitance measurements. This may further operate to enable the creation of silicon measurement based technology files in order to enhance validation of parasitic extraction tools.

FIG. 4 is a diagrammatic view illustrating multiple bit cells 64 in accordance with one embodiment of the present invention. Bit cells 64 represent an element to be included within or as part of test device 12 to which a capacitance is sought to be measured. A single bit cell 64 has been replicated multiple times across the diagram such that six columns of bit cell 64 are illustrated in the x-direction with eighty-eight corresponding rows in the y-direction in accordance with the example embodiment illustrated in FIG. 4. This replication of bit cell 64 may be performed in any suitable manner, such as by implementing software operable to duplicate bit cell 64. A specific bit cell 64 segment occupies a two-by-four block area, which has been bolded in the lower left-hand portion of FIG. 4. FIG. 4 also illustrates a set of strap cells 74 included in a set of strap rows 62. The strap cells provide connections to P-substrate and N-well.

Each bit cell 64 may be operable to store information or data within its internal structure. Bit cell 64 may represent a small quantifiable cell designation within a corresponding memory unit, such as a static random access memory (SRAM) element for example. Alternatively, bit cell 64 may be associated with any memory unit such as read-only memory (ROM) cells, volatile or non-volatile memory, persistent memory units, or any other suitable RAM cells or memory elements that include internal structure potentially inclusive of interconnects and/or transistors.

The replication of bit cell 64 as illustrated in FIG. 4 provides a more suitable environment or a more adequate boundary condition for measurements of a capacitance of a portion of an integrated circuit. The replication of bit cell 64 may further operate to provide an architecture similar to that of an integrated circuit chip.

FIG. 4 further illustrates a number of signals 66 provided to bit cell 64 that include VSSL (corresponding to the VSS line on the left-hand side of bit cell 64), BLL (the bit line value provided on the left-hand side of bit cell 64), $V_{DD}$ (as described above with reference to FIG. 1), BLR (the bit line value on the right-hand side of bit cell 64), and VSSR (the VSS value provided on the right-hand side of bit cell 64). Bit cell 64 further includes a coupling to a word line (WL) 68. These elements correspond to signals described below with reference to FIG. 5.

FIG. 5 is a simplified circuit diagram of the implementation associated with bit cell 64 of FIG. 4. FIGS. 4 and 5 illustrate an example implementation that offers the ability to initialize the internal structure (transistors or nodes) associated with bit cell 64. The initializing of nodes, transistors, or other internal elements within bit cell 64 operates to provide a stable state for those elements and increase capacitance measurement accuracy.

In operation, the BLP node illustrated in FIG. 5 may be coupled to central conductor 36 (as illustrated in FIG. 1). In addition, the VSSP node may be coupled to neighboring conductors 38 or 40 (these lines are shorted together and thus a connection or coupling may be made to either). With these connections in place, a capacitance measurement may be executed for any integrated circuit that includes active transistors (or non-active transistors where appropriate) and interconnects using the method illustrated in FIG. 3.

Strap cells 74 of strap row 62 receive an input from VSSP, after which the VSSP line may be disconnected from an associated P-substrate and the other VSS line in bit cell 64. The P-substrate may remain strapped through the other VSS line as illustrated in FIG. 5. The first cycle of charging and discharging on the VSSP input presets the state of every bit cell 64 in contact with the VSSP line. As a result, the storage node close to the BLP line will remain high in the subsequent VSSP (pulsing) cycles as illustrated in FIG. 5.

FIG. 6 is a diagrammatic view of bit cell 64, which further illustrates a next step in the capacitance measurement process. FIG. 6 further illustrates two segments 80a and 80b of strap cells in strap rows 62. Strap cell segment 80a is provided with a VDDP coupling and strap cell segment 80b is provided with a VSS line coupled to $V_{DD}$.

FIG. 7 is a simplified circuit diagram that corresponds to the next step in executing the capacitance measurement, which correlates to the implementation illustrated in FIG. 6. The circuit illustrated in FIG. 7 operates to measure a bit line to $V_{DD}$ coupling capacitance. This provides for a measurement of the total capacitance of a bit line and the component capacitance of the bit line with respect to $V_{DD}$. Central conductor 36 is coupled to BLP and VDDP is coupled to neighboring conductor 38 as illustrated in FIGS. 1 and 7. With these connections in place, a capacitance measurement may be executed using the method illustrated in FIG. 3.

In operation, selected strap cells of strap row 62 may be in contact with the VDDP line, whereby the VDDP line may be disconnected from an N-well 84 layer that is placed within the P-substrate. N-well 84 is coupled to bit segment 80a and may be positioned at the ends of the corresponding column. The N-well generally represents a layer that connects to P transistors of test device 12. Strap cells may be contacting the $V_{DD}$ connected VSS line, whereby the $V_{DD}$ connected VSS line may be disconnected from the P-substrate and the other VSS line. The P-substrate remains strapped through the other VSS line. The first cycle of charging and discharging on the VDDP input will preset the state of every bit cell touching the VDDP line. As a result, the storage node which is near the BLP line will remain low in the subsequent VDDP (pulsing) cycles as illustrated in FIG. 7.

FIG. 8 is a diagrammatic view illustrating bit cells 64 in accordance with a next step associated with executing the capacitance measurement. Each cell includes a single wordline. The embodiment illustrated in FIG. 8 operates to provide a word-line (WLP) total capacitance and the coupling capacitance of the word-line to the word-line in an adjacent cell (WLNP). The embodiments in FIGS. 8 and 9 further illustrate how internal nodes or transistors may be fixed or set to a steady state in order to increase accuracy of a capacitance measurement of an integrated circuit. One bit-line is held high while the other bit-line is held low as illustrated in FIG. 9. Central conductor 36 is coupled to WLP and WLNP is coupled to neighboring conductor 38 as illustrated in FIGS. 1 and 9. With these connections in place, a capacitance measurement may be executed using the method illustrated in FIG. 3.

In operation, the first cycle of charging and discharging on the WLP input will preset the state of every bit cell touching the WLP line. As a result, the storage node or element that is near the high bit line will remain high and the storage node near the low bit line will remain low in subsequent WLP (pulsing) cycles. This characteristic is illustrated in FIG. 9 as high and low features being provided to a corresponding node within bit cell 64.

In one embodiment of the present invention, the target conductor for which a capacitance measurement is sought may have its physical connection to transistor forming layers removed from bit cell 64. This implementation allows capacitances associated with interconnects within an integrated circuit to be isolated from capacitance measurements associated with transistors within the integrated circuit.

The ability to isolate or otherwise separate a capacitance associated with a transistor and the capacitance associated with surrounding interconnects offers the advantage of being able to precisely identify errors in the manufacturing process. The ability to identify two distinct capacitance measurements associated with these elements further allows for a more accurate identification of potential problems in the manufacturing process when design parameters vary too greatly. Thus, an administrator of the integrated circuit manufacturing process could modify or otherwise change manufacturing characteristics specific to a selected one of the interconnects within the integrated circuit or the internal nodes or transistors that may be included within the integrated circuit. Moreover, these distinct capacitance values for each element may be compared with simulation values in order to determine whether or not an integrated circuit is adequate for its intended design.

Accordingly, capacitance measurements of selected bit cells 64 illustrated in FIG. 4 may be taken, whereby conductor specifications, routing patterns, etching, and other suitable semiconductor parameters may be controlled or otherwise confined to designated specification guidelines. A simulation may be designed or created that includes exemplary or target measurements that correspond to the measurement dimensions associated with the portion of the integrated circuit under test. For example, a simulation may be conducted and a target capacitance determined that provides an optimal capacitance range per unit length of interconnects or per transistor. After measuring a capacitance associated with bit cell 64, the capacitance measurement may then be converted into a capacitance value per unit length. By correlating the simulation capacitance value to the actual capacitance measurement of the integrated circuit, a synchronization may be executed between design simulations or target measurements and the actual capacitance measurements for bit cell 64 engaged in the manufacturing process.

Where tested capacitance values fall outside of the designated range, it may be presumed that an error has occurred in the manufacturing process. It is important to note that the use of conductor width, conductor spacing, conductor thickness, dielectric thickness, or transistor specifications represent only examples of elements or parameters that may be targeted or that may be used for designing a simulation. Alternatively, various other integrated circuit parameters or characteristics may be used that are adequate to provide suitable capacitance values or targets for measurement system 10. It is foreseeable that system designers or semiconductor manufactures may designate other appropriate routing patterns of interest or other suitable integrated circuit characteristics to be used as a simulation basis. For example, a designer may be interested in a capacitance associated with one layer or a specific portion of an integrated circuit.

Figure 10:
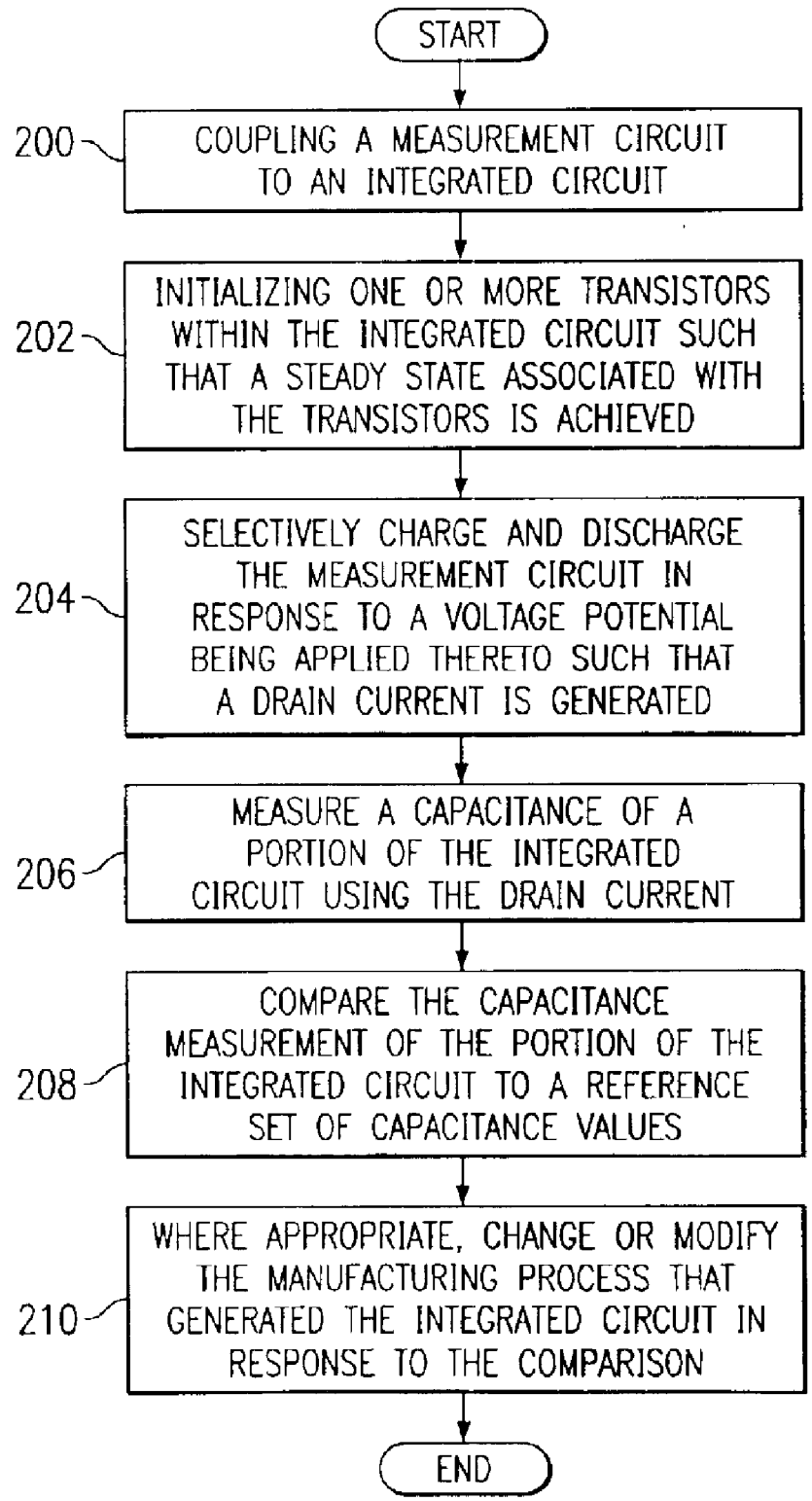
FIG. 10 is a flowchart illustrating a series of steps associated with a method for using a capacitance measurement to monitor the manufacture of an integrated circuit.

FIG. 10 is a flowchart illustrating a series of steps associated with a method for measuring a capacitance of bit cell 64 using measurement system 10 (or any other suitable capacitance measurement system) in accordance with one embodiment of the present invention. The method begins at step 200, where measurement system 10 may be coupled to an integrated circuit (or to any suitable portion thereof). The integrated circuit may include any suitable element, such as bit cell 64. At step 202, one or more transistors within the integrated circuit may be initialized such that a steady state associated with the transistors (or the internal structure of the integrated circuit) is achieved. At step 204, the measurement circuit may be selectively charged and discharged in response to a voltage potential being applied thereto such that a drain current is generated, as described above with reference to FIG. 1.

At step 206, a capacitance of a portion of the integrated circuit may be measured that is based on the drain current. At step 208, the capacitance measurement of the portion of the integrated circuit may be compared to a reference set (or target set) of capacitance values. This comparison provides a monitoring feature to measurement system 10. At step 210, and where appropriate, changes or modifications to the manufacturing process that generated the integrated circuit may be made in response to the comparison.

Some of the steps illustrated in FIGS. 3 and 10 may be changed or deleted where appropriate and additional steps may also be added to each of the flowcharts. These changes may be based on specific measurement architectures or particular testing arrangements or configurations of associated elements within the integrated circuit and do not depart from the scope or the teachings of the present invention.

Although the present invention has been described in detail with reference to particular embodiments, it should be understood that various other changes, substitutions, and alterations may be made hereto without departing from the spirit and scope of the present invention. For example, although the present invention has been described as operating with reference to a single test device 12, measurement system 10 may be used to measure the total capacitance of multiple conductor structures (or multiple portions of test device 12) and further resolve the total capacitance of a target element into its corresponding components with use of a single structure. This single unit may include the addition of a p and n element-pair for each additional conductor that is introduced into test device 12 such that a scalability feature is achieved without a significant increase in area. Measurement system 10 operates generally to provide enhanced flexibility for measuring many capacitances from the same multiple conductor structure (which may be large and complex in certain circumstances). Measurement system 10 also operates to reduce the number of structures, whereby multiple variations may be achieved through test program controlling of DC voltages instead of moving or repositioning probes or changing pulse locations.

In addition, numerous other arrangements of measurement system 10 may be performed without departing from the scope of the present invention. For example, transistor arrangements may be inverted for adjacent test structures such that the structure occupies only half the width of the area of the integrated circuit to be tested. This arrangement may allow structures to be placed such that one is below the other and extends them as long as possible in order to improve measurement accuracy.

Also, although measurement system 10 has been described as being implemented in conjunction with bit cell 64, measurement system 10 may be used to measure capacitance values of any suitable element. Any device, component, unit, element or object that generates a capacitance value may benefit from the teachings of the present invention. Bit cell 64 and the elements associated therewith have only been offered for purposes of teaching and this should not be construed to limit any implementation of measurement system 10.

Numerous other changes, substitutions, variations, alterations, and modifications may be ascertained by those skilled in the art and it is intended that the present invention encompass all such changes, substitutions, variations, alterations, and modifications as falling within the spirit and scope of the appended claims.

Moreover, the present invention is not intended to be limited in any way by any statement in the specification that is not otherwise reflected in the appended claims. Various example embodiments have been shown and described, but the present invention is not limited to the embodiments offered. Accordingly, the scope of the present invention is intended to be limited solely by the scope of the claims that follow.

What is claimed is:

1. A method for measuring a capacitance associated with a portion of an integrated circuit comprising:

coupling a measurement circuit to an integrated circuit;

initializing one or more transistors within the integrated circuit;

measuring a capacitance associated with a portion of the integrated circuit using the measurement circuit, the portion of the integrated circuit being selectively charged and discharged in response to a voltage potential being applied thereto such that a drain current is generated that serves as a basis for the capacitance measurement; and separating the capacitance measurement associated with the portion of the integrated circuit into a capacitance associated with the transistors included within the integrated circuit and a capacitance associated with one or more interconnects that are coupled to the transistors.

2. The method of claim 1, wherein the portion of the integrated circuit defines a static random access memory (SRAM) element.

3. The method of claim 2, further comprising:

duplicating the SRAM element multiple times before executing the capacitance measurement associated with the portion of the integrated circuit.

4. The method of claim 1, further comprising:

comparing the capacitance measurement associated with the portion of the integrated circuit to a reference set of capacitance values such that a parameter associated with the manufacturing process that generated the integrated circuit may be checked.

5. The method of claim 4, wherein the parameter associated with the manufacturing process is selected from the group consisting of:

(a) specifications associated with the transistor;

(b) a width of a selected one of the conductors;

(c) a thickness of a selected one of the conductors;

(d) a thickness associated with a dielectric positioned proximate to a selected two or more of the conductors; and (e) a spacing between a selected two or more of the conductors.

6. The method of claim 5, wherein the reference set of capacitance values is based on a simulation element having substantially the same structural characteristics as the integrated circuit.

7. The method of claim 5, wherein the manufacturing process that generated the integrated circuit is changed in response to comparing the capacitance measurement associated with the portion of the integrated circuit to the reference set of capacitance values.

8. An apparatus for measuring a capacitance associated with a portion of an integrated circuit comprising:

an integrated circuit that includes one or more transistors;

a measurement circuit coupled to the integrated circuit and operable to initialize one or more of the transistors within the integrated circuit such that a steady-state associated with one or more of the transistors is achieved, wherein the measurement circuit is used to measure a capacitance associated with a portion of the integrated circuit, the portion of the integrated circuit being selectively charged and discharged in response to a voltage potential being applied thereto such that a drain current is generated that serves as a basis for the capacitance measurement; and wherein the capacitance measurement associated with the portion of the integrated circuit is separated into a capacitance associated with the transistors included within the integrated circuit and a capacitance associated with one or more interconnects that are coupled to the transistors.

9. The apparatus of claim 8, wherein the portion of the integrated circuit defines a static random access memory (SRAM) element.

10. The apparatus of claim 9, wherein the SRAM element is duplicated multiple times before executing the capacitance measurement associated with the portion of the integrated circuit.

11. The apparatus of claim 8, further comprising:

a reference set of capacitance values, wherein the capacitance measurement associated with the portion of the integrated circuit may be compared to the reference set of capacitance values such that a parameter associated with the manufacturing process that generated the integrated circuit may be checked.

12. The apparatus of claim 11, wherein the parameter associated with the manufacturing process is selected from the group consisting of:

(a) specifications associated with the transistor;

(b) a width of a selected one of the conductors;

(c) a thickness of a selected one of the conductors;

(d) a thickness associated with a dielectric positioned proximate to a selected two or more of the conductors; and (e) a spacing between a selected two or more of the conductors.

13. The apparatus of claim 12, wherein the reference set of capacitance values is based on a simulation element having substantially the same structural characteristics as the integrated circuit.

14. The apparatus of claim 12, wherein the manufacturing process that generated the integrated circuit is changed in response to comparing the capacitance measurement associated with the portion of the integrated circuit to the reference set of capacitance values.

15. A system for measuring a capacitance associated with a portion of an integrated circuit comprising:

a measurement circuit operable to initialize one or more transistors within an integrated circuit such that a steady-state associated with one or more of the transistors is achieved, wherein the measurement circuit is coupled to the integrated circuit which is selectively charged and discharged in response to a voltage potential being applied thereto such that a drain current is generated that serves as a basis for the capacitance measurement; and wherein the capacitance measurement associated with the portion of the integrated circuit is separated into a capacitance associated with the transistors included within the integrated circuit and a capacitance associated with one or more interconnects that are coupled to the transistors.

16. The system of claim 15, wherein the portion of the integrated circuit defines a static random access memory (SRAM) element.

17. The system of claim 16, wherein the SRAM element is duplicated multiple times before executing the capacitance measurement associated with the portion of the integrated circuit.

* * * * *